(12) United States Patent
Schlögl et al.

(10) Patent No.: US 6,838,729 B2
(45) Date of Patent: Jan. 4, 2005

(54) SEMICONDUCTOR COMPONENT WITH ENHANCED AVALANCHE RUGGEDNESS

(75) Inventors: Andreas Schlögl, Ottobrunn (DE); Markus Schmitt, München (DE); Hans-Joachim Schulze, Ottobrunn (DE); Markus Vossebürger, München (DE); Armin Willmeroth, Augsburg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/134,113

(22) Filed: Apr. 29, 2002

(65) Prior Publication Data
US 2003/0155610 A1 Aug. 21, 2003

(Under 37 CFR 1.47)

(30) Foreign Application Priority Data

Apr. 27, 2001 (DE) .......................................... 101 20 656

(51) Int. Cl.⁷ .............................................. H01L 29/76

(52) U.S. Cl. ........................ 257/328; 257/341; 257/329; 257/339; 257/129; 257/135; 257/136; 257/491; 257/492

(58) Field of Search ................................. 257/341, 328, 257/329, 339, 129, 135, 136, 491, 492, 493, 213, 327

(56) References Cited

U.S. PATENT DOCUMENTS

| 4,754,310 A | 6/1988 | Coe |
| 5,216,275 A | 6/1993 | Chen |
| 5,438,215 A | 8/1995 | Tihanyi |

FOREIGN PATENT DOCUMENTS

DE 198 40 032 C1 11/1999

*Primary Examiner*—Minhloan Tran
*Assistant Examiner*—Tan Tran
(74) *Attorney, Agent, or Firm*—Laurence A. Greenberg; Werner H. Stemer; Ralph E. Locher

(57) ABSTRACT

The invention relates to a semiconductor component with enhanced avalanche ruggedness. At the nominal current of this semiconductor component, in the event of an avalanche the voltage applied between two electrodes is 6 % or more above the static reverse voltage at the same temperature.

24 Claims, 6 Drawing Sheets

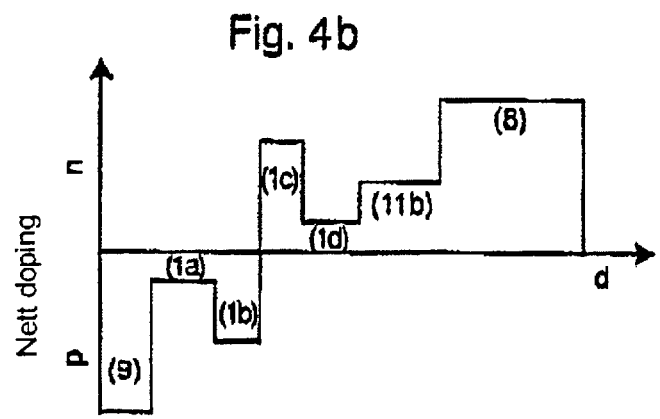
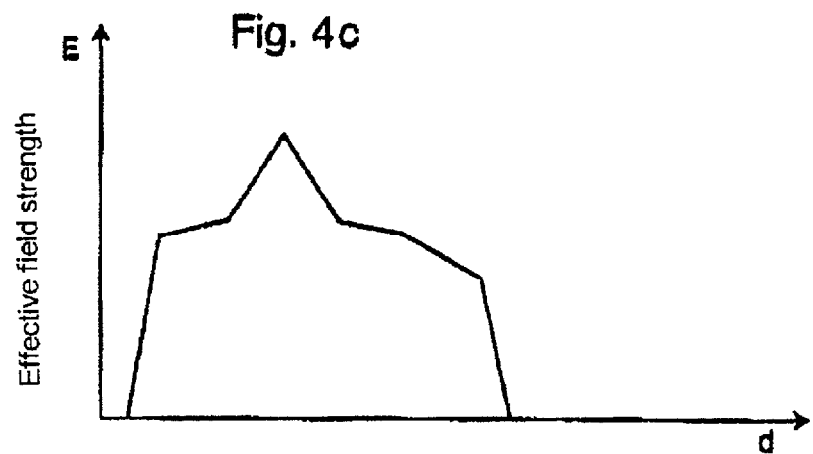
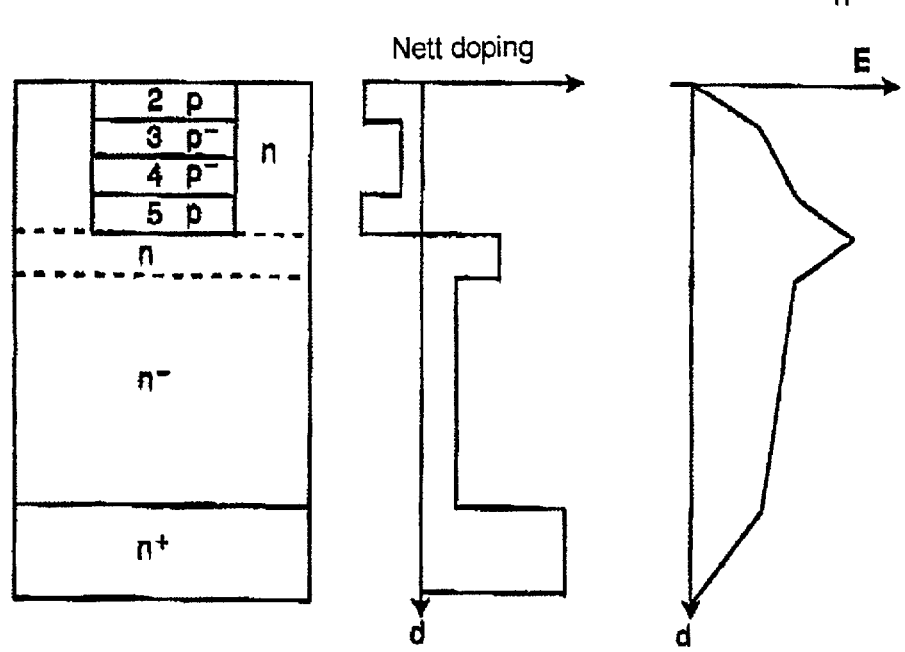

SEMICONDUCTOR COMPONENT WITH ENHANCED AVALANCHE RUGGEDNESS

BACKGROUND OF THE INVENTION

Field of the Invention

The invention relates to a semiconductor component with enhanced avalanche ruggedness. The semiconductor component includes a semiconductor body which is provided with at least two electrodes and in which, in particular in a drift zone provided between the electrodes, areas of one conductivity type and areas of the other conductivity type, opposite the one conductivity type, alternate with one another, so that in the region of the drift zone formed by these areas there is substantially charge carrier compensation. The semiconductor component can be a vertical or a lateral semiconductor component. In the case of a vertical semiconductor component, the at least two electrodes, preferably the drain and source of a transistor, are located on two mutually opposite main surfaces of the semiconductor body, while in the case of a lateral semiconductor component, these electrodes are provided on the same main surface. The one conductivity type is preferably the p conductivity type, so that the other conductivity type is the n conductivity type. However, the conductivity types can also be reversed. The semiconductor body preferably is formed from silicon. However, it can also be formed from another semiconductor material, such as SiC or $A_{III} B_y$.

An important objective in the development of new power semiconductor components is to combine high blocking capability with the lowest possible forward losses. Power semiconductor components are therefore intended to withstand high voltages, when they are operated in the reverse state, and to cause only small forward losses when operated in the forward state, and therefore have a low static resistance.

In compensation components, such as are described for example in U.S. Pat. No. 4,754,310 issued to Coe, U.S. Pat. No. 5,216,275 issued to Chen, U.S. Pat. No. 5,438,215 issued to Tihanyi, which is commonly owned with the instant application, and German Patent DE 198 40 032 C1, which is commonly owned with the instant application, this object is largely reached by applying the principle of charge carrier compensation: the drift zone absorbing the voltage includes an alternating sequence of mutually oppositely doped areas implemented in a specific way. In these areas, while taking account of the geometric dimensions of the areas, the doping levels are set in such a way that the spatial charges of the alternating doping compensate each other in the horizontal direction in the regions formed by the respective areas of different doping ("compensation regions") if, in a vertical component, for example, source and drain are disposed on mutually opposite main surfaces of the semiconductor body. This makes it possible to apply a high electric field over the entire drift zone.

In compensation components, doping concentrations of acceptors and donors, which by far exceed the doping concentrations of corresponding semiconductor components in conventional technology without compensation regions, are therefore possible in the drift zone.

In the drift zone, however, considerably improved electrical conductivity is achieved by the compensation regions, as compared with conventional semiconductor components, so that in forward operation, static losses can be significantly reduced and low static on resistances can be achieved. In the event of the compensation component being operated in the reverse state, depending on the concrete doping relationships in the compensation regions, a characteristic course of the electric field is established in the drift zone, which is significant for the resulting blocking capability of the compensation component. In an actual construction of a compensation component, the following problems occur, specifically under avalanche conditions.

If the compensation component is operated in series with an inductive load but without a freewheeling diode and is then switched off, then the voltage can rise above the breakdown voltage, in order to carry the load current. Since the charge carriers generated by the avalanche effect need a few fractions of nanoseconds to cross the drift zone, the voltage rises slightly above the value actually needed statically for this current. A voltage peak therefore occurs, so that avalanche effect provides a massively amplified generation of electrons and holes. Then, above a critical current threshold, if the concentration of charge carriers in a sufficiently extensive zone of the space charge region considerably exceeds the concentration of the static doping atoms, there is therefore a dynamic avalanche, and the voltage on the compensation component therefore breaks down, as a result of which fewer charge carriers are immediately generated which immediately again leads to a rise in the voltage present on the compensation component. While the current is forced by the external inductive load, the voltage oscillates at a high frequency in the range of GHz, which is generally designated by the term "TRAPATT oscillation" (TRAPATT=Trapped Plasma Avalanche Triggered Transit).

Such TRAPATT oscillations can result in local damage or even to destruction of the compensation component. With regard to EMC regulations, they can additionally be critical or even impermissible for specific applications of the component. In other words, TRAPATT oscillations restrict the area of application of compensation components severely and reduce their reliability, not least because of the risk of destruction.

A further problem is formed by high turn-off losses of an intrinsic diode contained in the compensation component. Since, for example, there is a doping sequence of $p^+$, p, n and $n^+$ between source contact and drain contact, the component can be operated not only as a transistor but also as a diode.

In forward operation, the drift zone is flooded with many charge carriers. If the polarity of the intrinsic diode is then reversed in the reverse direction, the stored charge formed by these charge carriers has to flow away before the component can sustain the reverse voltage. A large reverse current peak therefore occurs (in this regard, see also FIG. 8 below). However, because the voltage present on the component is already rising at the same time, this results in high turn-off losses. This ultimately leads to warming of the compensation component and therefore to a limited switching frequency.

SUMMARY OF THE INVENTION

It is accordingly an object of the invention to provide a semiconductor component with enhanced avalanche ruggedness that overcomes the hereinafore-mentioned disadvantages of the heretofore-known devices of this general type in which the current threshold for the onset of TRAPATT oscillation is raised considerably and that is distinguished by reduced turn-off losses of the trinsic diode.

With the foregoing and other objects in view, there is provided, in accordance with the invention, a semiconductor component with enhanced avalanche ruggedness. The semiconductor component includes two semiconductor electrodes. A semiconductor body is connected to the two electrodes. A drift zone defines a region and is provided between the two electrodes. The region generates charge carriers. Areas of one conductivity type and areas of the other conductivity type, opposite the one conductivity type, are disposed in the drift zone in a given direction between the two electrodes. An overall doping of the drift zone is set by appropriate doping of the areas of the one conductivity type and/or of the other conductivity type. The overall doping of the drift zone produces an electric field having a local peak limiting charge carriers being generated to a narrow area during avalanche. The narrow area generates at least about 50% of the overall charge carriers being generated in the drift zone and assumes at most 15% of a length of a section of the drift zone being locate between the at least two electrodes.

With the objects of the invention in view, there is also provided a semiconductor component with enhanced avalanche resistance, wherein doping in the drift zone in a direction between the two electrodes is set by proton irradiation and creating a local peak in an electric field based on the doping in the drift zone.

With the objects of the invention in view, there is also provided a semiconductor component with enhanced avalanche resistance, wherein doping in the drift zone in a direction between the two electrodes is set by helium irradiation from a source side.

In order to achieve this object, a semiconductor component of the type mentioned at the beginning is characterized in accordance with the invention in that, in the event of an avalanche at the nominal current of the semiconductor component, the voltage present between the at least two electrodes is 6% or more above the static reverse voltage at a current intensity of about 10 $\mu A/mm^2$ and at the same temperature. In this case, "nominal current" is to be understood as the continuous current that the component can draw at most at a junction temperature of 25° C.

The above condition for the voltage at nominal current can be complied with by appropriate doping of the drift zone. In this case, it is advantageous for the doping in the drift zone to be set such that, in the course of the electric field based on the doping in the drift zone in the direction between the two electrodes, there is a local peak. The local peak limits charge generation to a narrow area during an avalanche breakdown. Accordingly, at least about 50% of the charge carriers generated overall in the drift zone are generated in the narrow area, if the latter assumes at most 15% of the length of the section of the drift zone between the at least two electrodes.

It is particularly advantageous for even at least about 60% of the charge carriers generated overall in the drift zone to be generated in the narrow area if the latter assumes at most 10% of the length of the section of the drift zone between the at least two electrodes. For comparison, it should be noted that in the case of a conventional component (cf. e.g. "standard" in FIG. 1), fewer than 30% of the charge carriers are generated over 10% of the length of the section of the drift zone.

In accordance with a further object of the invention, in a relatively simple manner, the current threshold value for the onset of TRAPATT oscillations is raised considerably. This leads to significant advantages of the semiconductor component according to the invention. As a result of increasing the robustness, higher reliability is achieved. The safety for applications is increased, and the area of application is expanded as a result of fulfilling more severe criteria, such as specific EMC regulations.

It has been shown that the increase in the voltage of 6% or more above the static breakdown voltage, which occurs in the event of an avalanche and can be attributed in particular to the specific doping of the drift zone, is associated with an increase in the threshold value for the onset of TRAPATT oscillations. This voltage increase of 6% or more is in this case the value that can primarily be measured.

The invention is preferably applied to the previously conventional compensation components. In general, however, the advantages listed above can also be achieved in power semiconductor components other than these compensation components, in which problems can occur as a result of TRAPATT oscillations.

The significant factor in the semiconductor component according to the invention is therefore, firstly, that the increase in the TRAPATT oscillation threshold is accomplished by setting a suitable doping profile in the drift zone.

It has been documented experimentally that, for an enhanced avalanche behavior, a field peak in the course of the electric field in the drift zone is important. This is because this field peak concentrates the charge carrier generation to a narrow area during an avalanche breakdown. As a result, the slope of the dn/dU characteristic curve (n: number of charge carriers; U: voltage applied) is reduced, which is to be explained in more detail below.

If, for example, a MOS transistor using compensation technology (CoolMOS transistor) is switched off with an external inductive load but no freewheeling diode, the inductance of the load forces the current to continue to flow as a displacement current in the transistor. As a result, the voltage rises until charge carrier generation sets in as a result of the avalanche effect. Since, however, the charge carriers generated by the avalanche effect arrive at the contacts of source and drain with a certain delay, too many charge carriers are actually generated in order to carry the predefined current. However, this means that the voltage breaks down until the excess charge carriers have flowed away. The cycle then begins again from the start. The start of the oscillation depends critically on the fact that even with a slight increase in the voltage, the number of charge carriers generated as a result of the avalanche rises over a large physical region of the drift zone, since only under these conditions does the electric field decrease to a greater extent, and therefore the voltage can oscillate. A good measure for comparing two different field courses is the slope dj/dU of the current density j as a function of the voltage U applied. If this value dj/dU decreases, then the current threshold for the oscillations rises.

In another exemplary embodiment of the invention, proton irradiation with suitable energy and dose is used. As a result of this proton irradiation, which has an n-doping effect, the electric field in the drift zone is changed in such a way that the slope dj/dU (j=current density in the reverse direction) of the reverse characteristic becomes flatter in the area of the oscillation threshold, as a result of which the threshold for TRAPATT oscillations rises.

Another advantageous effect of proton irradiation resides in the fact that a high impurity density is produced in the drift zone, which increases the recombination of free charge carriers. As a result, the stored charge in forward operation of the intrinsic diode is considerably reduced. A reduced stored charge reduces the turn-off losses and therefore the warming of the component. In turn, this achieves a higher maximum switching frequency.

In the case of a CoolMOS transistor, the irradiation with protons can preferably be carried out from the drain side. The energy and dose selected can be, for example, 3.91 MeV and $10^{12}$ protons/cm$^2$. As a result, in the area of a maximum range of about 140 μm, about 25 μm under the gate oxide, an n-doping concentration of the order of magnitude of $5 \times 10^{14}$ cm$^{-3}$ is produced.

A particularly advantageous value for the proton irradiation is given by $5 \times 10^{11}$ protons/cm$^2$ or possibly more.

Critical for the improved avalanche behavior is that the proton energy and the proton dose for any desired compensation component are chosen in such a way that the aforementioned field peak is generated in the resulting course of the electric field by the doping. Then, as was described above, this field peak concentrates the charge carrier generation to a narrow area in the event of an avalanche breakdown, which reduces the slope of dj/dU in the manner described.

The proton irradiation can preferably be formed at two different energies. At the first energy, which is higher than the second energy, a first proton maximum with a charge carrier lifetime minimum is then generated close under the gate insulating layer at a distance of 20–30 μm, for example, from the latter. This proton maximum contributes to the formation of the local peak in the electric field. At the second energy, a second proton maximum is generated, which is placed in the drift zone, in its area facing away from the first proton maximum, and leads to a reduced stored charge of the intrinsic diode.

Finally, it has been shown that helium irradiation with helium ions, which is preferably carried out from the source side, in the intrinsic diode leads to a reduction in the charge stored in the forward direction, which contributes to enhancing the switching speed, since fewer charges have to flow away when the polarity is reversed. As a result, the reverse current peak is reduced. In addition, in the case of this irradiation variant, enhancement of the avalanche resistance is to be observed if helium is radiated into the area of the drift zone facing away from the gate oxide. The dose and energy for the helium irradiation can be given as $(1 \ldots 8) \times 10^{10}$ helium ions/cm$^2$ and 5 to 8 MeV, preferably 6 to 7.5 MeV.

Other features which are considered as characteristic for the invention are set forth in the appended claims.

Although the invention is illustrated and described herein as embodied in a semiconductor component with enhanced avalanche resistance, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 4B is a graph plotting net doping in the area of the compensation pillar shown in FIG. 4A over the entire width of the drift zone and of the substrate;

FIG. 4C is a graph plotting the effective electric field strength on account of the net doping shown in FIG. 4B;

FIG. 4D is a sectional view showing an alternate embodiment of the compensation pillar;

FIG. 4E is a graph plotting net doping in the area of the compensation pillar shown in FIG. 4F over the entire width of the drift zone of the substrate;

FIG. 4F is a graph plotting the effective electric field strength on account of the net doping shown in FIG. 4E;

DESCRIPTION OF THE PREFERRED EMBODIMENTS

Figure 1:
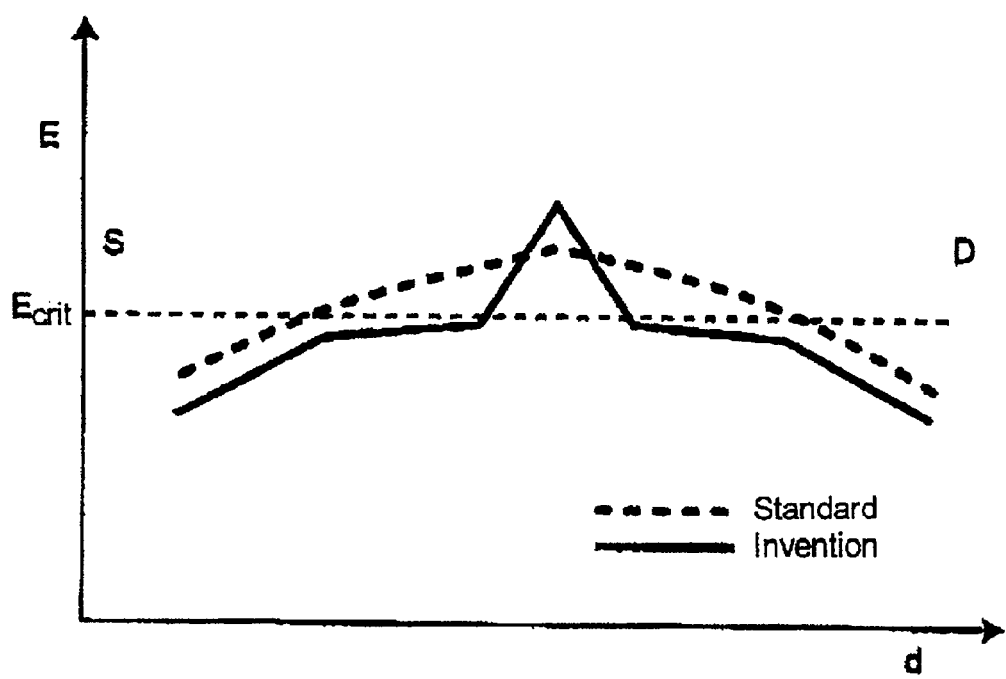
FIG. 1 is a graph plotting the electric field as a function of the width of the drift zone for a conventional vertical compensation component (dashed line) and for a vertical compensation component according to the invention (solid line), in each case in the vertical direction of the component.

Referring now to the figures of the drawings in detail and first, particularly to FIG. 1 thereof, there is shown schematically the course of the electric field E between source S and drain D in the drift zone of a conventional CoolMOS transistor ("standard"; cf. the dashed line) and of a CoolMOS transistor as an exemplary embodiment of the invention (cf. the solid line). It can clearly be seen that in the case of the standard CoolMOS transistor, the electric field lies above a critical field strength $E_{crit}$ over a greater width or depth d between source S and drain D in the drift zone than in the case of the CoolMOS transistor according to the invention. In the invention, by forming a field peak by appropriately setting the doping course, it is ensured that the electric field in the drift zone grows to a field strength above the critical field strength $E_{crit}$ only in a narrow area, so that the charge carrier generation is limited to this narrow area, which sharply reduces the occurrence of TRAPATT oscillations. In other words, deliberately setting the doping profile creates an increase in the TRAPATT oscillation threshold. From this, there follows in turn an increase in the voltage present between source S and the drain D in the event of an avalanche of 6% or more above the static reverse voltage at the same temperature.

Figure 2:
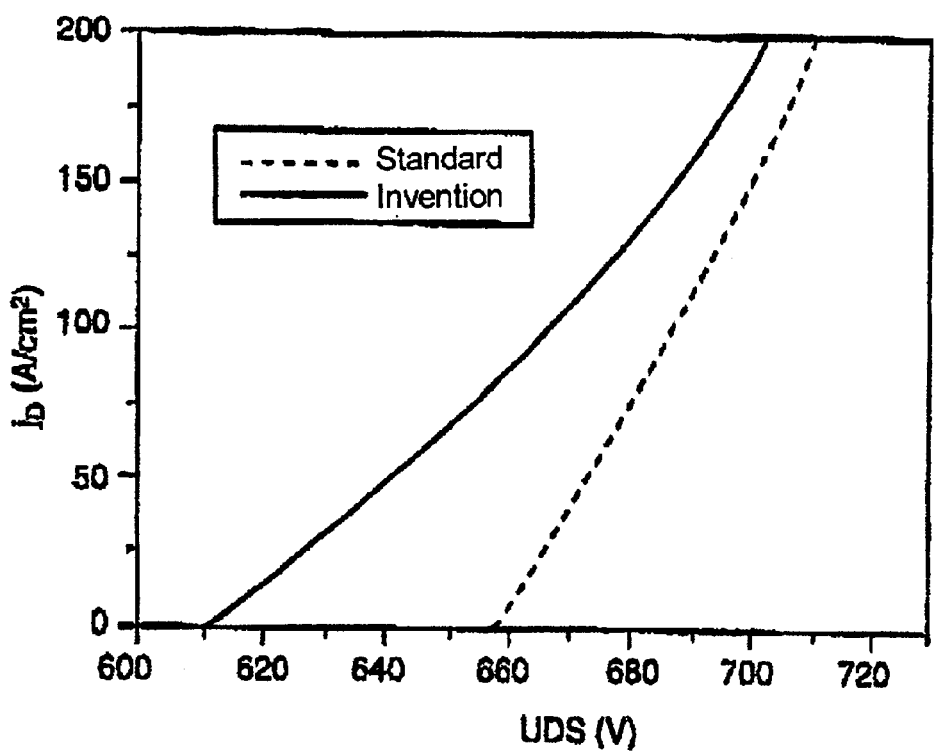
FIG. 2 is a graph plotting the course of simulated breakdown characteristics of the drain current density $j_D(A)$ as a function of the drain-source voltage UDS(V) for a previously conventional CoolMOS transistor (dashed line) and for a CoolMOS transistor of the compensation component according to the invention (solid line)

FIG. 2 shows schematically the effects of a course of the electric field having a field peak on the breakdown behavior. It can be seen that, in the case of a compensation component corresponding to the invention, there is a considerably lower slope of the drain current density $j_b$ as a function of the drain-source voltage UDS, as compared with a conventional compensation component ("standard"). In other words, the "dj/dU" characteristic has a smaller slope.

The course of the two curves "standard" for a conventional compensation component and "invention" for the compensation component according to the invention in FIG. 2 becomes comprehensible if the resulting courses of the electric fields in FIG. 1 are taken into account. While in the case of a doping profile optimized in accordance with the present invention and having a field peak, the charge carriers arising from collision ionization are predominantly generated only in the area of the field peak of the electric field. In the case of a conventional course of the doping profile (i.e. the dashed line in FIG. 1), the charge carriers produce additional pairs of charge carriers virtually over the entire width of the drift zone. As a result, the dj/dU characteristic rises more steeply (i.e. the curve "standard" in FIG. 2), so that the compensation component becomes overall more susceptible to oscillation.

In the case of the invention, about 50% of the charge carriers generated overall in the drift zone are generated in the narrow area of the field peak, if this area assumes about 15% of the section of the drift zone between the electrodes. It is still more advantageous if 60% of the charge carries are generated in an area assuming 10% of the section.

In the experiment and in the simulation, it is possible to show that given a load of about 50 $\mu$H, the oscillation threshold for TRAPATT oscillations is of the order of magnitude of about 125 A/cm$^2$ in the case of a standard compensation component, while this threshold rises to more than 200 A/cm$^2$ in the case of a corresponding compensation component according to the invention.

Figure 3A:
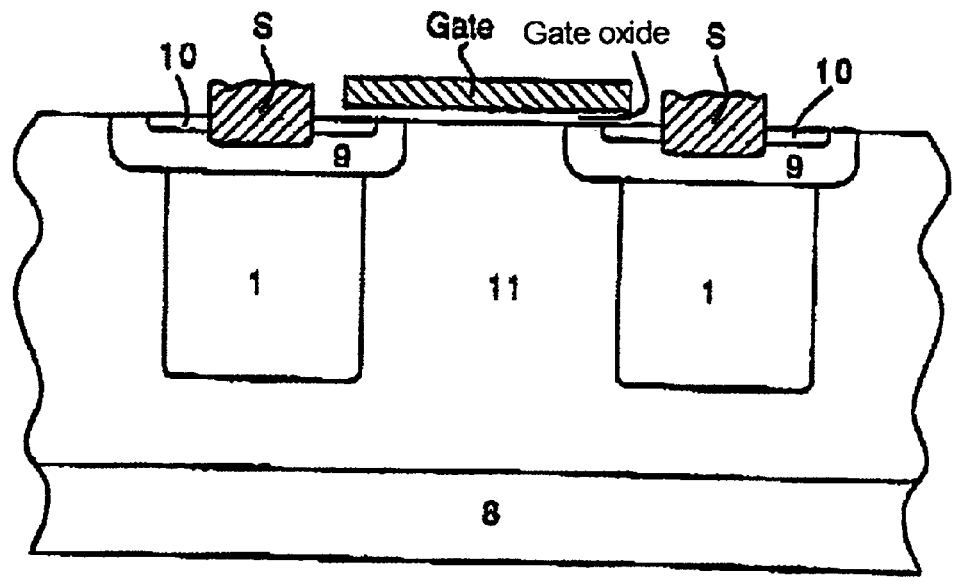
FIGS. 3A–3C are sectional views showing various embodiments of compensation pillars.
Figure 3B:
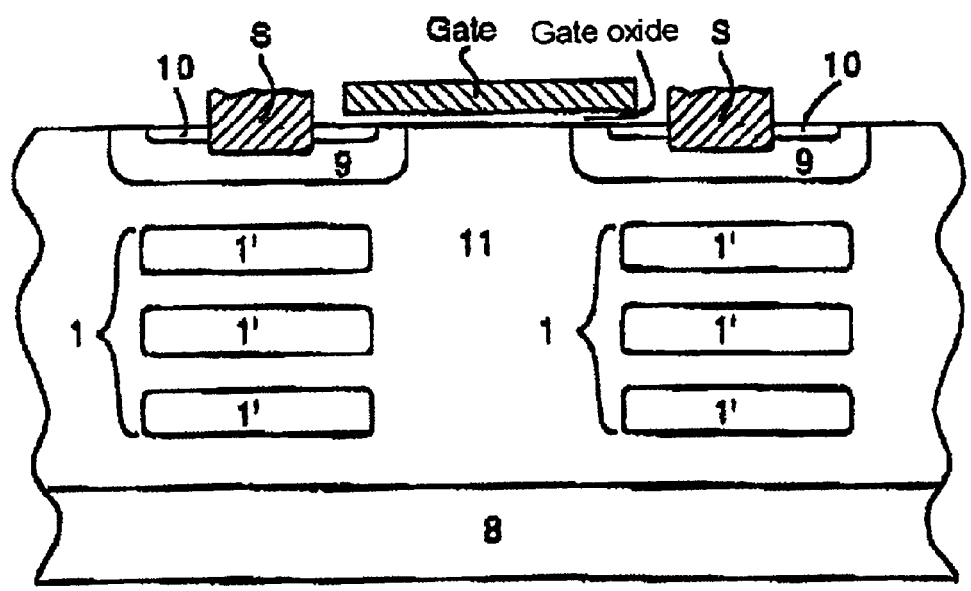
Figure 3C:
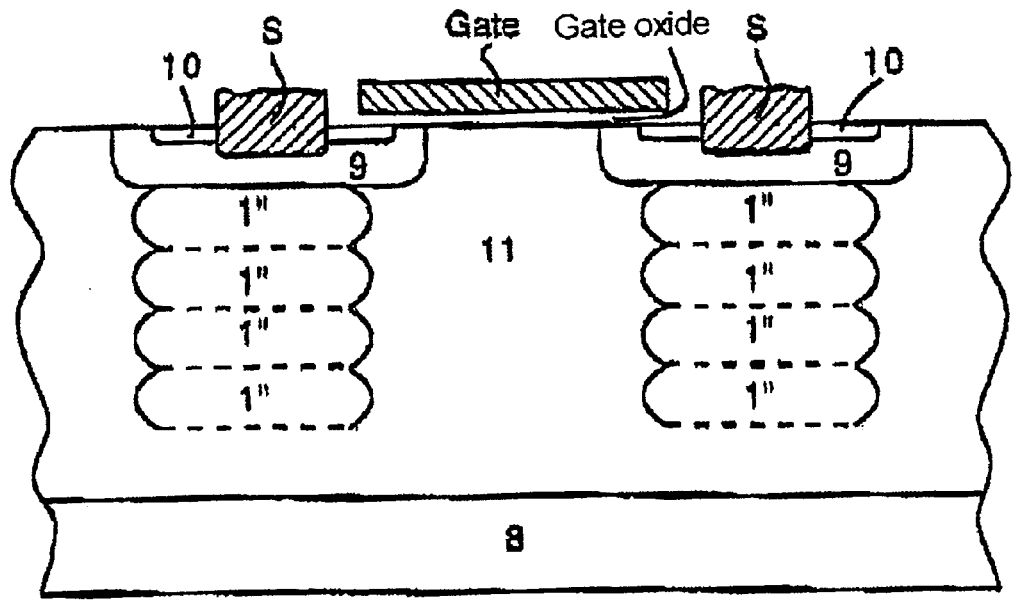

FIGS. 3A to 3C show various variants for the configuration of compensation pillars 1 in compensation components. These compensation pillars 1 can be coherent, as shown in FIG. 3A, substantially corresponding to the exemplary embodiment of FIG. 4A. In FIG. 3A, the p-doped compensation pillar 1 adjoins a trough zone 9 containing a source zone 10 with a source contact S, and is located in an n-conductive region 11. However, the compensation pillars 1 can also be formed from areas 1' which are floating and intrinsically not coherent (cf. FIG. 3B) which, given appropriate doping by, for example, implementation and subsequent diffusion, can possibly grow into areas 1"(cf. FIG. 3C). The compensation column can therefore be at least partly floating.

A doping profile suitable for generating a field peak can be set without the voltage resistance of the compensation component being substantially impaired. One example of a suitable doping profile is to be explained in more detail below using FIG. 4A (course of a p-doped compensation or doping pillar 1 in an n-doped area for forming a drift zone), FIG. 4B (net doping for the drift zone of FIG. 4A) and FIG. 4C (course of the field strength in the doping pillar of FIG. 4A). Of course, the compensation or doping pillar can be configured in the manner shown in FIGS. 3A to 3C.

Figure 4A:
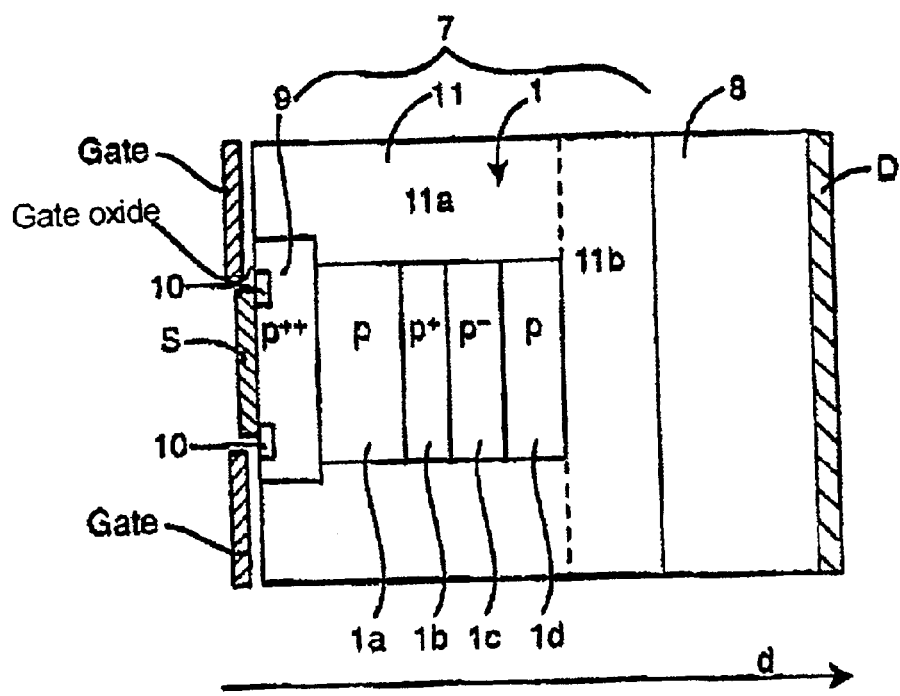
FIG. 4A is a sectional view through a compensation pillar.

FIG. 4A shows a p-doped compensation or doping pillar 1 including a p$^{++}$-doped area 9, a p-doped area 1a, a p$^+$-doped area 1b, a p$^-$-doped area 1c and a p-doped area 1d in an n$^-$-doped area 11 which is disposed on an n$^+$-doped silicon substrate 8. A charge-compensated drift zone 7 is formed from the areas 9, 1a to 1d and 11. The area 11 can have two differently doped regions 11a, 11b. The region 11a is preferably doped more highly than the region 11b.

The p$^{++}$-doped area 9 can form a p-doped trough zone which contains an n-doped source zone 10 and which, together with the source zone 10, is contacted by a source electrode S, while a drain contact D can be provided on the substrate 8. A gate electrode (gate) is embedded in a gate-insulating layer of silicon dioxide (gate oxide). The p$^{++}$-doped area 9 or the trough zone forms a more or less uniformly doped region. If appropriate, it can also include two differently highly p-doped areas.

In the case of the doping shown in FIG. 4A for the doping pillar 1 a net doping as shown in FIG. 4B is established over the entire width of the doping pillar 1 and area 11, that is to say in the drift zone 7: the p$^{++}$-doped area 9 permits the p-net doping to predominate, while, for example, in the p$^-$-doped area 1c the n-net doping prevails. Likewise, in the p$^+$-doped area 1b, the p-net doping prevails while underneath the doping pillar 1 in the region 11b there is, of course, only the n-net doping. The respective areas and regions are indicated in brackets in FIG. 4B.

The course of the electric field strength E occurring as a result of the net doping illustrated in FIG. 4B is shown qualitatively in FIG. 4C over the width d of the drift zone 7: in the region between the areas 1b and 1c, a field peak of the electric field E is established. Important for the formation of the field peak are the transition (p$\Rightarrow$p$^+$) between the areas 1a and 1b, the transition (p$^+\Rightarrow$p$^-$) between the areas 1b and 1c, and the transition (p$^-\Rightarrow$p) between the areas 1c and 1d.

The compensation pillar 1 can also include, for example, a p-conductive area 2, a p$^-$-conducting area 3, a p$^-$-conducting area 4 and a p-conducting area 5, as shown in FIG. 4D. The values for net doping and effective field strength specified in FIG. 4E are then established. Here, too, a field peak is clearly formed as shown in FIG. 4F.

Figure 5A:
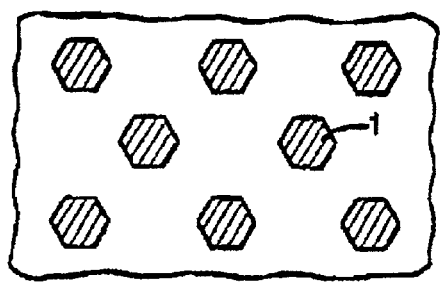
FIGS. 5A–5D are plan views showing different embodiments of compensation pillars.
Figure 5B:
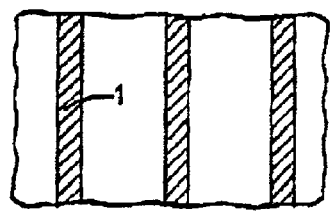
Figure 5C:
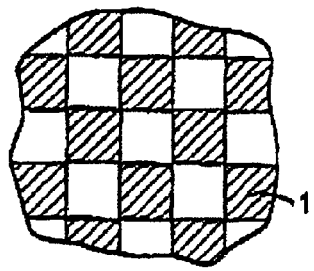
Figure 5D:
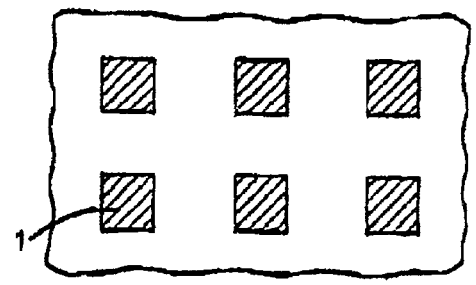

FIGS. 5A to 5D show, in plan view (for example viewed from the source electrode S), various embodiments of the compensation pillars 1: these can be constructed, for example, to be hexagonal (FIG. 5A), strip-shaped (FIG. 5B), checkerboard-pattern-shaped (FIG. 5C), or isolated rectangular or square (FIG. 5D).

Figure 6:
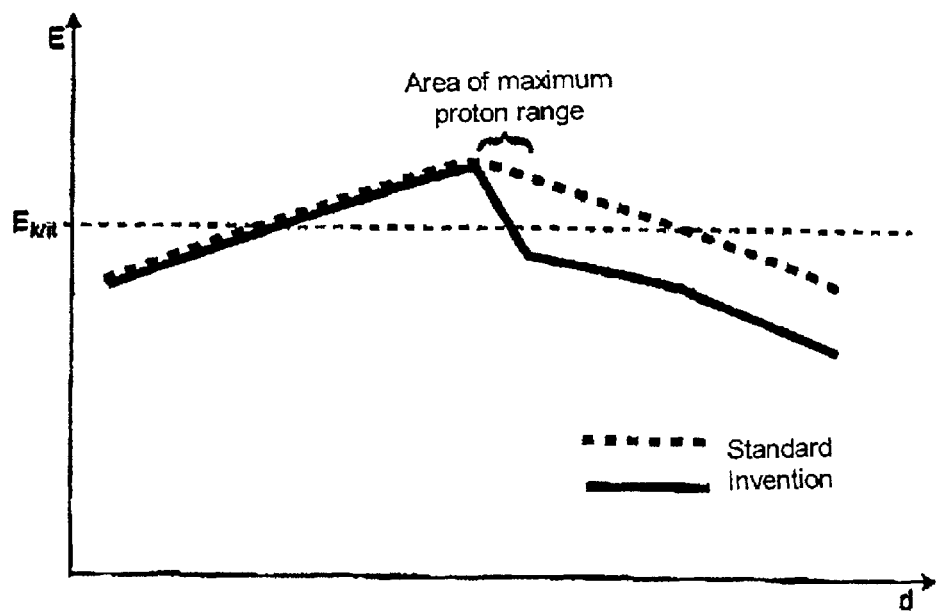
FIG. 6 is a graph plotting the course of the electric field strength E(V/cm) as a function of the distance (μm) from the gate oxide, that is to say as a function of the width d of the drift zone, for an unirradiated compensation component and for a compensation component irradiated with protons.

As investigations by the inventors have shown, a field peak in the course of the electric field can also be achieved by proton irradiation from the drain side (on the right in FIG. 4A). FIG. 6 shows graphically the simulated course of the electric field E as a function of the width d of the drift zone 7 in a CoolMOS transistor without proton irradiation ("standard") and with proton irradiation ("invention"). The proton irradiation can be performed with a dose such that an additional doping of about 5×10$^{14}$ donors cm$^{-3}$ results in the area of the maximum range. The dose is expediently set such that optimization of the intrinsic diode results.

The two curves in FIG. 6, namely "standard" and "invention", show that the electric field E clearly has a field peak after the proton irradiation as compared with the course of the field without proton irradiation. This field peak signifies an increase in the TRAPATT oscillation threshold, as was explained above using the preceding exemplary embodiments.

Figure 7:
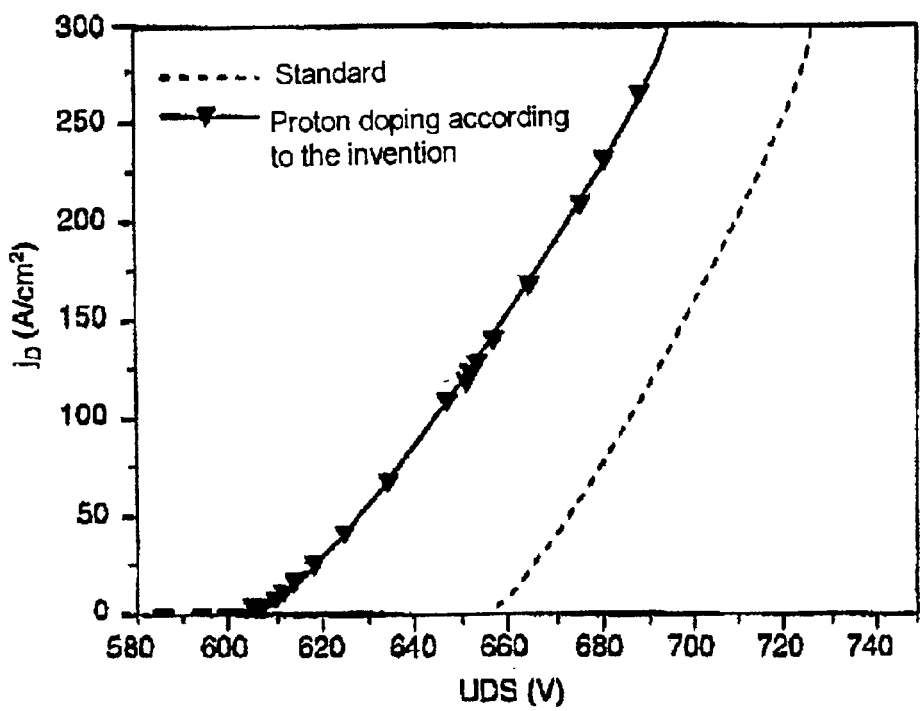
FIG. 7 is a graph plotting the course of simulated reverse characteristics for the drain current density $j_D(A)$ as a function of the drain-source voltage UDS(V) for an unirradiated compensation component and for an irradiated compensation component.

FIG. 7 illustrates the effects of the proton irradiation and the course induced by this of the electric field on the breakdown behavior. It transpires that, in the case of the compensation component according to the invention with the optimized doping profile, there is a considerably lower slope of the curve dj/dU but a lower breakdown voltage is also provided. In the case of the optimized doping profile ("proton doping according to the invention"), in particular in the area to the right of the field maximum (i.e. FIG. 6), through with the electrons generated in the field peak pass, the electric field is reduced considerably as compared with a conventional compensation component ("standard"). As a result, only a negligible additional number of further electron-hole pairs can be generated there as a result of collision ionization. The generation of charge carriers is concentrated on a narrow area, the j-U characteristic for the drain current density $j_D$ as a function of the drain-source voltage UDS (cf. FIG. 7) becomes flatter, and the compensation component becomes more resistant to oscillation.

Experiments by the inventors have shown that the oscillation threshold is also at a current density of about 125 A/cm$^2$ in the case of this exemplary embodiment of the conventional compensation component, while the compensation component irradiated with protons in accordance with the invention on average begins to oscillate only above a current density of about 185 A/cm$^2$. The breakdown voltage at a current density $j_D$=125 mA/cm$^2$ decreases in the experiment from about 668 V in the case of an unirradiated compensation component to only 610 V in the case of the compensation component irradiated in accordance with the invention.

Figure 8:
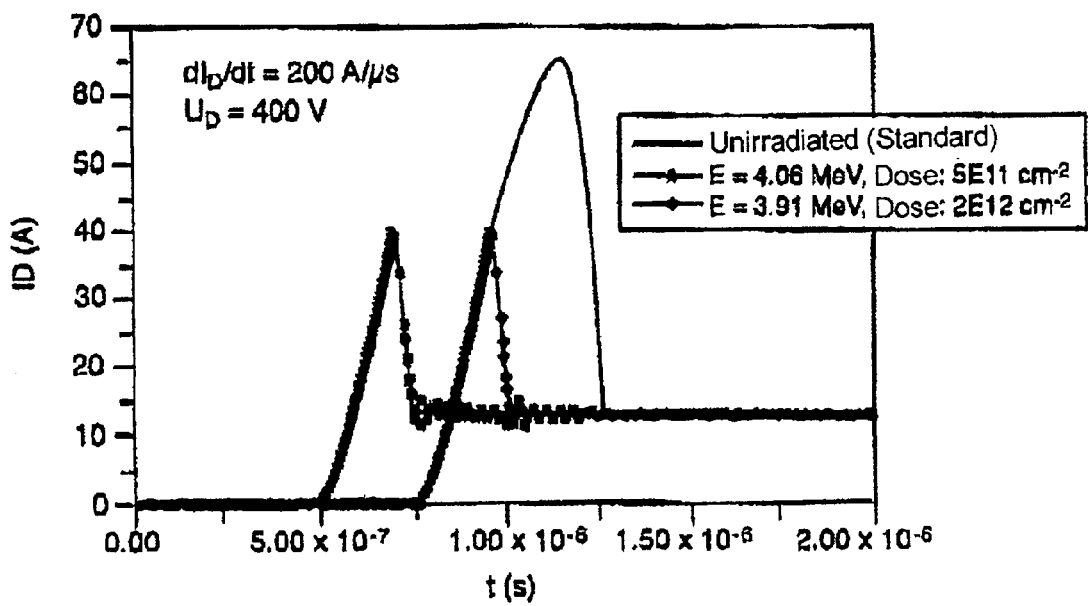
FIG. 8 is a graph plotting the course of experimentally determined reverse current peaks in the drain current ID(A) as a function of the time t(s) for an unirradiated compensation component and for two compensation components irradiated with protons with different parameters.

FIG. 8 illustrates the course of the reverse current peak of the drain current ID in a switch in a step-down controller circuit for two proton energies or doses. If a proton maximum is selected that lies about 20 to 30 $\mu$m under the gate oxide and is produced with a dose of about 2×10$^{12}$ protons/cm$^2$, then approximately the same reduction in the reverse current peak is achieved as that at an energy of 4.06 MeV (proton maximum about 15 to 20 $\mu$m under the gate oxide) and a dose of 5×10$^{11}$ protons/cm$^2$. The displacement of the peak or peak value can be attributed to different trigger points of the oscilloscope. In other words, the closer the proton maximum comes to lie under the gate oxide, but without damaging the latter, the smaller is the reverse current peak at the same dose, since given higher energy in a larger area of the spatial charge zone, the charge carrier lifetime is reduced. The best compromise between high avalanche resistance and a fast intrinsic diode results with an energy E=3.91 MeV and a dose of 5×10$^{11}$ protons/cm$^2$.

As has already been mentioned above, the proton irradiation can be performed at one or more energies, preferably two energies, from the drain side (rear side). In the case of two different energies, the irradiation at the first, higher energy contributes to the formation of the local peak of the electric field, while the irradiation with the second, lower energy promotes the reduction in the stored charge of the intrinsic diode.

Instead of proton irradiation or in addition to the latter, helium irradiation (He$^+$) can also be conducted from the source side or front side in the manner explained above by which the avalanche resistance can likewise be enhanced and, at the same time, the switching speed of the intrinsic diode can be improved. The exact physical causes are still being investigated.

We claim:

1. A semiconductor component with enhanced avalanche ruggedness, comprising:
   two electrodes;
   a semiconductor body connected to said two electrodes;
   a drift zone defining a region and extending between said two electrodes along a given drift zone length; and
   areas of a first conductivity type and areas of a second conductivity type, opposite the first conductivity type, disposed in said drift zone inline between said two electrodes for effecting a charge carrier compensation in said drift zone;
   during an avalanche at a nominal current of the semiconductor component, a voltage between said two electrodes being at least 6% above a static reverse voltage at a current intensity of about 10 $\mu$A/mm$^2$ and a given temperature, the nominal current equaling a maximum continuous current drawable by the semiconductor component at a junction temperature of 25° C.

2. The semiconductor according to claim 1, wherein:
   a current having a current density flows between said two electrodes; and
   an oscillation threshold for Trapped Plasma Avalanche Triggered Transit (TRAPATT) oscillations lies at least at a current density of about 200 $\mu$A/cm$^2$ above a current density of said current flowing between said two electrodes.

3. The semiconductor component according to claim 1, wherein helium irradiation from a source side is performed.

4. The semiconductor component according to claim 3, including a helium maximum being generated by the helium irradiation said end of said drift zone opposing said gate insulating layer.

5. The semiconductor component according to claim 3, wherein the helium irradiation includes a dose of (1 . . . 8)×10$^{10}$ helium ions/cm$^2$.

6. The semiconductor component according to claim 3, wherein the helium irradiation is conducted at an energy of 5 to 8 MeV.

7. The semiconductor component according to claim 6, wherein the helium irradiation is conducted at an energy of 6 to 7.5 MeV.

8. The semiconductor component according to claim 1, including:
   a trough zone being formed of the other conductivity type; and
   a compensation pillar being formed from said areas of the first conductivity type and either having at least one of a floating part over and a connection to said trough zone.

9. The semiconductor component according to claim 8, further comprising further compensation pillar disposed in a configuration having a hexagonal structure.

10. The semiconductor component according to claim 8, further comprising a further compensation pillar disposed in a configuration having a strip-shaped structure.

11. The semiconductor component according to claim 8, further comprising further compensation pillars disposed in a configuration having a checkerboard-pattern-shaped structure.

12. The semiconductor component according to claim 8, further comprising further compensation pillars disposed in a configuration having a rectangular structure.

13. The semiconductor component according to claim 8, further comprising further compensation pillars disposed in a configuration having a square structure.

14. The semiconductor according to claim 1, wherein an overall doping of said drift zone is set by appropriate doping of at least one of said areas causing an electric field to have a local peak between said two electrodes for limiting generation of charge carriers to a narrow area during avalanches, and said narrow area generates at least 50% of a total number of the charge carriers generated in said drift zone and has a length of at most 15% of said drift zone length.

15. The semiconductor component according to claim 14, wherein said narrow area generates at least about 60% of the charge carriers generated in said drift zone when said narrow area forms at most 10% of the length of said section of said drift zone between said two electrodes.

16. The semiconductor component according to claim 14, wherein the additional doping forming the field peak is formed by proton irradiation from a drain side.

17. The semiconductor component according to claim 16, wherein:
   said areas of one conductivity type have a more highly doped area between two more lowly doped areas; and
   a region with a net doping of one conductivity type immediately adjoins a region with a net doping of the other conductivity type in order to generate the field peak.

18. The semiconductor component according to claim 16, wherein the proton irradiation also optimizes an intrinsic diode.

19. The semiconductor component according to claim 18, wherein the proton irradiation is performed at a first proton energy.

20. The semiconductor component according to claim 19, wherein the proton irradiation is performed with a dose of at least about $5\times10^{11}$ protons/cm$^2$ at an energy of about 3.91 MeV.

21. The semiconductor component according to claim 20, wherein the proton irradiation is also performed at an additional second proton energy, the additional second proton energy being lower than the first proton energy.

22. The semiconductor component according to claim 21, wherein:
   said drift zone has a first end and a second end opposing said first end; and
   a gate insulation layer is disposed above said first end of said drift zones; and
   a second proton maximum generated by the proton irradiation at the second proton energy and having a charge carrier lifetime maximum is placed in said second end of said drift zone.

23. The semiconductor component according to claim 19, including:
   a first end of said drift zone;
   a gate insulation layer above said first end of said drift zone;
   a first proton maximum being generated by the proton irradiation at the first proton energy, having a charge carrier lifetime minimum, and being placed below said gate insulation layer.

24. The semiconductor component according to claim 23, wherein said first proton maximum lies 20 to 30 $\mu$m below said gate insulating layer.

* * * * *